(12) United States Patent
Kuniie et al.

(10) Patent No.: US 8,446,144 B2
(45) Date of Patent: May 21, 2013

(54) FREQUENCY CHARACTERISTICS MEASURING DEVICE

(75) Inventors: Shinji Kuniie, Tokyo (JP); Satoru Aoyama, Tokyo (JP); Yoshimasa Ogino, Tokyo (JP)

(73) Assignee: Advantest Corporation, Tokyo (JP)

( * ) Notice: Subject to any disclaimer, the term of this patent is extended or adjusted under 35 U.S.C. 154(b) by 309 days.

(21) Appl. No.: 12/745,685

(22) PCT Filed: Dec. 15, 2008

(86) PCT No.: PCT/JP2008/072741
§ 371 (c)(1),
(2), (4) Date: Jun. 1, 2010

(87) PCT Pub. No.: WO2009/081780
PCT Pub. Date: Jul. 2, 2009

(65) Prior Publication Data
US 2010/0259245 A1   Oct. 14, 2010

(30) Foreign Application Priority Data

Dec. 20, 2007   (JP) .................................. 2007-328323

(51) Int. Cl.
*G01R 13/00* (2006.01)
*H04R 29/00* (2006.01)

(52) U.S. Cl.
USPC .............................. 324/76.23; 702/66; 381/59

(58) Field of Classification Search
USPC .............................. 324/76.23; 702/66; 381/59
See application file for complete search history.

(56) References Cited

U.S. PATENT DOCUMENTS 5,847,559 A * 12/1998 Takaoku et al. ............ 324/76.27

FOREIGN PATENT DOCUMENTS

| JP | 61-237537 A | | 10/1986 |
|---|---|---|---|
| JP | 8-54429 A | | 2/1996 |
| JP | 10-282163 | * | 10/1998 |
| JP | 10-282163 A | | 10/1998 |
| JP | 3071225 U | | 6/2000 |
| JP | 2002-14123 A | | 1/2002 |
| JP | 2002-101431 A | | 4/2002 |
| JP | 2004-245807 A | | 9/2004 |
| JP | 2007-33171 A | | 2/2007 |
| JP | 2007-199021 A | | 8/2007 |

OTHER PUBLICATIONS

Wataru (JP 10-282163, Advantest Corp. Oct. 23, 1998, English Translation).*

* cited by examiner

*Primary Examiner* — Melissa Koval
*Assistant Examiner* — Farhana Hoque
(74) *Attorney, Agent, or Firm* — patenttm.us

(57) ABSTRACT

It is possible to provide a frequency characteristics measuring device which can simplify the configuration for performing a measurement and reduce the undue effort required for the measurement.

A spectrum analyzer (10) includes: two sets of measuring units having mixers (110, 210), local oscillators (112, 212), and IF sections (120, 220) for separately measuring frequency characteristics of two input signals; a trigger generation section (310) which generates a trigger signal for specifying a measurement start timing in each of the two sets of measuring units; a sweep control section (300) which simultaneously sends an instruction to the two local oscillators (112, 212) when a trigger signal is inputted and performs a sweep control so that the two local oscillators (112, 212) output local oscillation signals of the same frequency at the same timing.

8 Claims, 3 Drawing Sheets

FREQUENCY CHARACTERISTICS MEASURING DEVICE

TECHNICAL FIELD

The present invention relates to a frequency characteristics measuring device for measuring a frequency characteristic or the like of an input signal in a spectrum analyzer or the like.

BACKGROUND ART

A spectrum analyzer is conventionally known which measures a frequency characteristic of an input signal by performing frequency sweep (see, for example, Patent Document 1). The spectrum analyzer has input terminals in two lines and measures a frequency characteristic of a signal input through one of the input terminals. The measured frequency characteristic is displayed through a display section.

Patent Document 1: Japanese Patent Laid-Open No. 8-233875 (pp. 3-4, FIGS. 1-2)

DISCLOSURE OF THE INVENTION

Problems to be Solved by the Invention

The conventional spectrum analyzer disclosed in Patent Document 1 for example has two input terminals but performs measurement of a frequency characteristic with respect to a signal input through one of the two input terminals. Therefore, simultaneously making measurements of frequency characteristics of two kinds of signals requires two spectrum analyzers and an externally attached trigger device for generating a trigger signal for synchronization of the measurements, and there is a problem that the configuration for measurement is complicated and considerable amounts of time and work are required for measurement. As a method of comparing frequency characteristics of two kinds of signals, a method of printing and comparing corresponding measurement results is conceivable. This method, however, has a problem that it is difficult to perform analysis with accuracy. As another method of comparing frequency characteristics of two kinds of signals, a method of capturing frequency characteristics of two kinds of signals obtained by measurement in an external analysis device (external computer) and making comparison by performing data processing thereon is conceivable. This method requires the provision of an analysis device and performing an analysis operation separately from measurement and therefore has a problem that the configuration for measurement is further complicated and considerable amounts of time and work are required for measurement.

The present invention has been created in consideration of these points and an object of the present invention is to provide a frequency characteristic measuring device capable of simplifying the configuration for measurement and reducing the amounts of time and work required for measurement. Another object of the present invention is to provide a frequency characteristic measuring device capable of easily improving the analysis accuracy.

Means for Solving the Problems

To solve the above-described problems, the present invention provides a frequency characteristics measuring device having a plurality of measuring units which respectively measure frequency characteristics of a plurality of input signals, and a trigger generation unit which generates a trigger signal designating measurement start timing in each of the plurality of measuring units. Making measurements on a plurality of input signals in parallel with each other in synchronization of a trigger signal internally generated is thereby enabled and the need for a device externally connected is eliminated. Consequently, the configuration for measurement can be simplified and the amounts of time and work required for measurement can be reduced.

It is desirable that each of the plurality of measuring units include a local oscillator in which frequency sweep is performed, a mixer which performs frequency conversion of the input signal by using a local oscillation signal output from the local oscillator, and an intermediate frequency filter which extracts a signal component of a predetermined frequency from an intermediate frequency signal output from the mixer, and that frequency sweep in each of the local oscillators respectively included in the plurality of measuring units be started in accordance with timing of generation of the trigger signal by the trigger generation unit. Frequency sweep time alignment can be achieved in this way and timing of measurement of frequency characteristics can be easily adjusted.

It is also desirable that a sweep control unit be further provided which controls timing of frequency sweep in each of the local oscillators respectively included in the plurality of measuring units, and that the sweep control unit selectively perform first sweep control starting frequency sweep in each of the local oscillators respectively included in the plurality of measuring units in accordance with timing of generation of the trigger signal, and second sweep control starting frequency sweep at separate time in the local oscillators respectively included in the plurality of measuring units. In this way, selection from the operation to simultaneously make measurements on a plurality of input signals and the operation to separately make measurements on the plurality of input signals is enabled.

It is also desirable that a local oscillator be further provided in which frequency sweep is performed, that each of the plurality of measuring units include a mixer which performs frequency conversion of the input signal by using a local oscillation signal output from the local oscillator, and an intermediate frequency filter which extracts a signal component of a predetermined frequency from an intermediate frequency signal output from the mixer, and that frequency sweep in each of the local oscillators be started in accordance with timing of generation of the trigger signal by the trigger generation unit. Use of the common local oscillation signal enables frequency sweep time alignment as well as phase alignment.

It is also desirable that each of the plurality of measuring units further include a characteristic value measuring unit which measures a characteristic value of the signal component extracted by using the intermediate frequency filter. Use of the characteristic value measuring units respectively adapted to the plurality of measuring units enables utilization of hardware conventionally used and enables reducing the development cost or the like.

It is also desirable that a characteristic value measuring unit be further provided which measures characteristic values of the signal components extracted by using the intermediate frequency filters respectively included in the plurality of measuring units. Use of the common characteristic value measuring unit adapted to the plurality of measuring units enables reducing the cost by reducing the number of component parts.

It is also desirable that a display processing unit be further provided which simultaneously displays through a display unit the characteristic values obtained in correspondence with the plurality of measuring units. In such a case, it is desirable to display the plurality of characteristic values in a state of being discriminable from each other (for example, in different colors). The method of simultaneously displaying the plurality of measurement results reduces the amount of time and work for performing an analysis operation separately from measurement with an eternal analysis device and is capable of easily improving the analysis accuracy.

Figure 1:
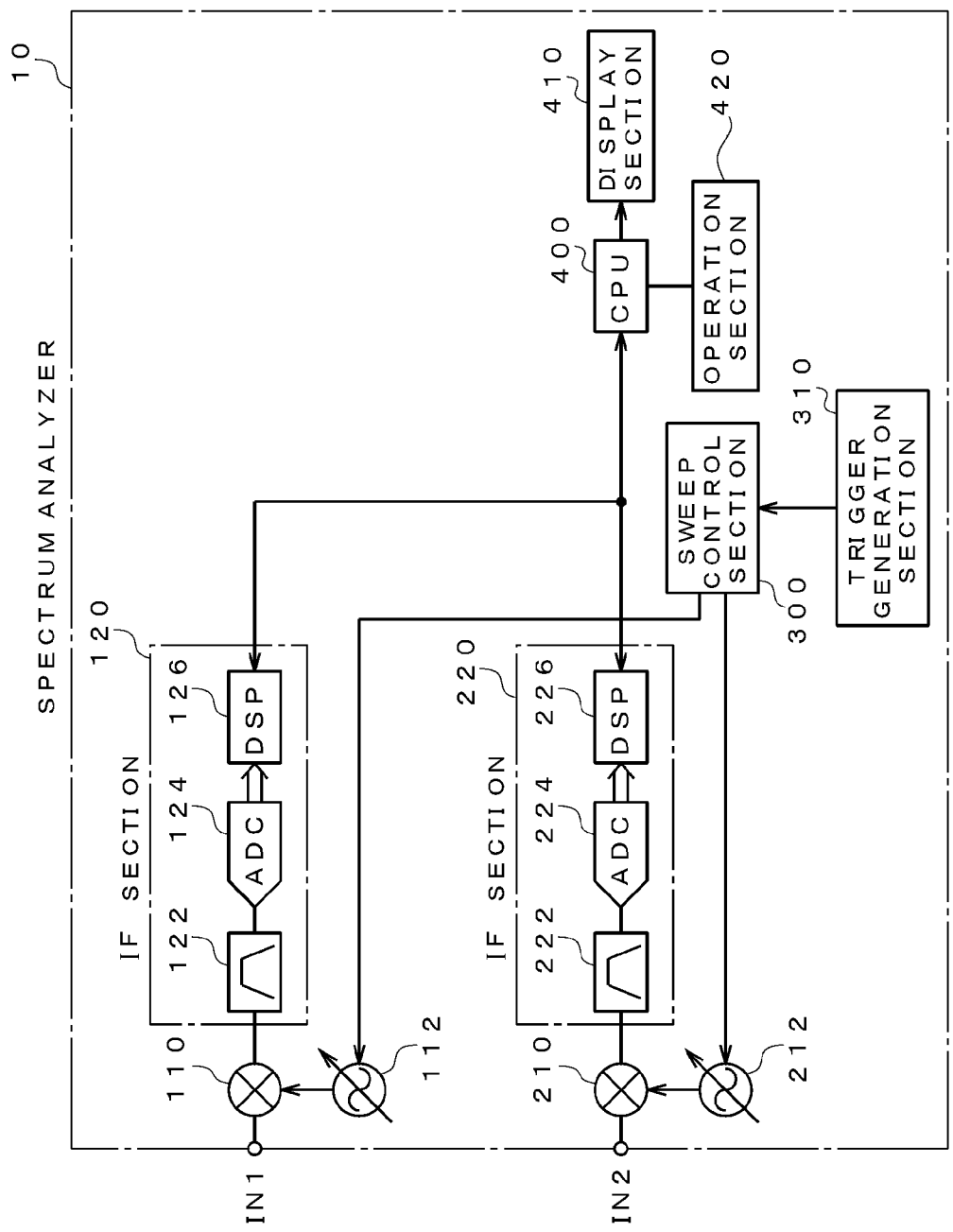
FIG. 1 is a diagram showing the configuration of a spectrum analyzer in an embodiment of the present invention.

DESCRIPTION OF SYMBOLS 10, 10A Spectrum analyzer
110, 210 Mixer
112, 212 Local oscillator
120, 220 IF section (intermediate frequency processing section)
122, 222 Intermediate frequency filter
124, 224 ADC (analog-digital converter)
126, 226 DSP (digital signal processor)
300 Sweep control section
310 Trigger generation section
400 CPU
410 Display section
420 Operation section

BEST MODE FOR CARRYING OUT THE INVENTION

A spectrum analyzer which is a frequency characteristics measuring device according to an embodiment of the present invention will be described in detail below with reference to the drawings. FIG. 1 is a diagram showing the configuration of a spectrum analyzer in an embodiment of the present invention. As shown in FIG. 1, the spectrum analyzer 10 in the present embodiment includes mixers 110 and 210, local oscillators 112 and 212, IF sections (intermediate frequency processing sections) 120 and 220, a sweep control section 300, a trigger generation section 310, a CPU 400, a display section 410, and an operation section 420.

The spectrum analyzer 10 in the present embodiment has two input terminals IN1 and IN2 through which measurement target signals (signals to be measured) are input. The spectrum analyzer 10 simultaneously measures frequency characteristics of two measurement target signals fin1 and fin2 input through these two input terminals IN1 and IN2, and displays spectrums as measurement results.

The mixer 110, the local oscillator 112 and the IF section (intermediate frequency processing section) 120 are provided to measure frequency characteristics of the measurement target signal fin1 input through one input terminal IN1. The mixer 110 is supplied with the measurement target signal fin1 input through one input terminal IN1 and a local oscillation signal $f_{OSC1}$ output from the local oscillator 112, and outputs a signal which is a mixture of the measurement target signal fin1 and the local oscillation signal $f_{OSC1}$. The local oscillator 112 outputs the local oscillation signal $f_{OSC1}$ whose oscillation frequency is sweepable through a predetermined range.

The IF section 120 performs analog signal processing and digital signal processing on the output signal from the mixer 110 to perform frequency characteristics measurement. The IF section 120 includes an intermediate frequency filter 122, an ADC (analog-to-digital converter) 124 and a DSP (digital signal processor) 126. The intermediate frequency filter 122 is a band-pass filter which allows only a predetermined intermediate frequency component (intermediate frequency signal) in the output signal from the mixer 110 to pass therethrough. The ADC 124 converts the intermediate frequency signal output from the intermediate frequency filter 122 into digital data by sampling at a predetermined sampling frequency. The DSP 126 performs various kinds of signal processing on the intermediate frequency signal converted into digital data to measure characteristic values (e.g., the signal level and the bit error rate) of the intermediate frequency signal. More specifically, the DSP 126 performs processing including detection processing and image removal processing on the intermediate frequency signal.

Similarly, the mixer 210, the local oscillator 212 and the IF section 220 are provided to measure frequency characteristics of the measurement target signal fin2 input through the other input terminal IN2. The mixer 210 is supplied with the measurement target signal fin2 input through the other input terminal IN2 and a local oscillation signal $f_{OSC2}$ output from the local oscillator 212, and outputs a signal which is a mixture of the measurement target signal fin2 and the local oscillation signal $f_{OSC2}$. The local oscillator 212 outputs the local oscillation signal $f_{OSC2}$ whose oscillation frequency is sweepable through a predetermined range.

The IF section 220 performs analog signal processing and digital signal processing on the output signal from the mixer 210 to perform frequency characteristics measurement. The IF section 220 includes an intermediate frequency filter 222, an ADC 224 and a DSP 226. The intermediate frequency filter 222 is a band-pass filter which allows only a predetermined intermediate frequency component (intermediate frequency signal) in the output signal from the mixer 210 to pass therethrough. The ADC 224 converts the intermediate frequency signal output from the intermediate frequency filter 222 into digital data by sampling at a predetermined sampling frequency. The DSP 226 performs various kinds of signal processing on the intermediate frequency signal converted into digital data to measure characteristic values of the intermediate frequency signal. More specifically, the DSP 226 performs processing including detection processing and image removal processing on the intermediate frequency signal.

Only the essential portion of the configuration necessary for measurement of frequency characteristics has been described. In actuality, however, attenuators are provided between the input terminal IN1 and the mixer 110 and between the input terminal IN2 and the mixer 210 to perform signal level adjustment. Also, in actuality, a combination of a mixer and a local oscillator or a plurality of combinations of mixers and local oscillators are added to perform image removal processing. The configuration necessary for frequency measurement can be changed as desired according to required specifications. However, it is important to provide two sections identical in configuration to each other in application of the present invention.

When a trigger signal is input, the sweep control section 300 simultaneously sends commands to the two local oscillators 112 and 212 to perform frequency sweep control so that the local oscillation signals equal to each other in frequency are output from the two local oscillators 112 and 212 simultaneously with each other. More specifically, a first PLL circuit (not shown) including the one local oscillator 112 and a variable frequency divider and a second PLL circuit (not shown) including the other local oscillator 212 and another variable frequency divider are included in the spectrum analyzer 10 and the sweep control section 300 changes the frequency dividing ratios of the two variable frequency dividers while maintaining the frequency dividing ratios in a state of being equal to each other, thereby performing frequency sweep of the local oscillation signals from the two local oscillators 112 and 212. The trigger generation section 310 generates the trigger signal when a user enters a command to start measuring. This trigger signal is input to the sweep control section 300.

The CPU 400 performs overall control of the spectrum analyzer 10 and performs processing for simultaneously displaying through the display section 410 the two measurement results (characteristic values) output from the IF sections 120 and 220 and processing for setting a measurement condition according to a command from a user using the operation section 420. The operation section 420 is provided with a plurality of components such as switches and operating variable resistors to be operated by a user. A user enters a command to set a measurement condition, a command to start measuring, a command to stop measuring and other commands by operating these components.

The above-described mixers 110 and 210, local oscillators 112 and 212 and IF sections 120 and 220 correspond to the plurality of measuring units; the trigger generation section 310 corresponds to the trigger generation unit; the sweep control section 300 corresponds to the sweep control unit; and the DSPs 126 and 226 correspond to the characteristic value measuring unit.

Figure 2:
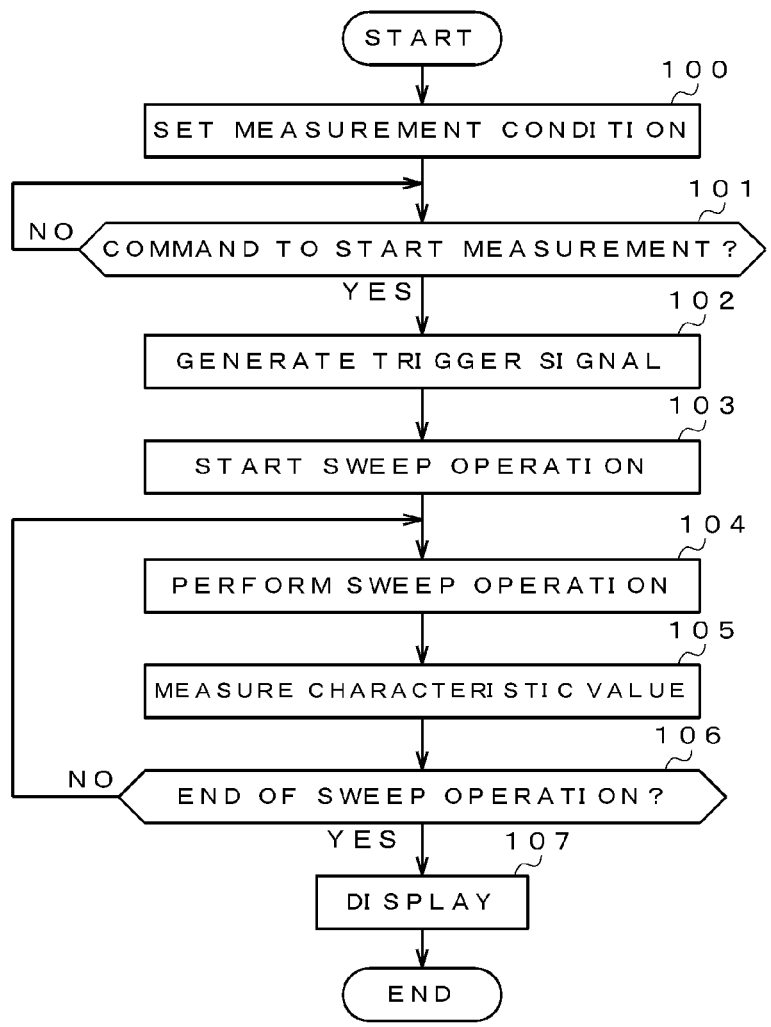
FIG. 2 is a flowchart showing the process of operating the spectrum analyzer in the present embodiment.

The spectrum analyzer 10 in the present embodiment has the above-described configuration. The operation of the spectrum analyzer in the present embodiment will next be described. FIG. 2 is a flowchart showing the process of operating the spectrum analyzer 10 in the present embodiment.

A measurement condition is set according to the content of a command from a user (step 100), and the CPU 400 thereafter determines whether or not a command to start measuring has been issued (step 101). If no command to start measuring is issued, a negative determination is made and this determination is repeated. Setting of a measurement condition is not necessarily made for each measuring operation. Step 100 is omitted if there is no need for setting a measurement condition.

When a command to start measuring is issued, an affirmative determination is made in determination in step 101. The trigger generation section 310 then generates a trigger signal (step 102). The trigger signal may be generated, for example, by outputting a signal in pulse form or by changing the level of a signal from a low level to a high level (or changing from a high level to a low level).

When the trigger signal is input, the sweep control section 300 simultaneously sends sweep commands to the two local oscillators 112 and 212 to perform frequency sweep operations with the two local oscillators 112 and 212 from the same starting time (steps 103 and 104). In parallel with the frequency sweep operations, the IF sections 120 and 220 respectively measure characteristic values of the intermediate frequency signals (step 105).

The sweep control section 300 also determines whether or not an end of the sweep is reached (step 106), makes a negative determination before the sweep frequency reaches the upper limit (or the lower limit) of the measuring range, and returns the process to step 104 to continue the frequency sweep. When the sweep frequency reaches the upper limit (or the lower limit) of the measuring range, an affirmative determination is made in determination in step 106. Subsequently, the CPU 400 displays the results of measurement with the two IF sections 120 and 220 through the display section 410 (step 107), thereby completing the sequence of operations for measuring frequency characteristics.

Figure 3:
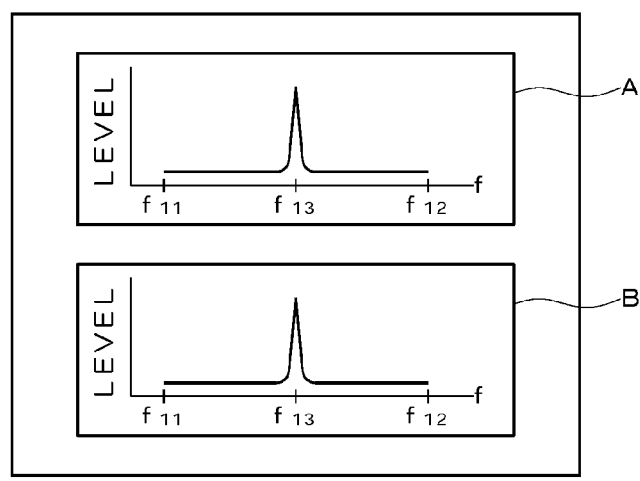
FIG. 3 is a diagram showing an example of display on the spectrum analyzer in the present embodiment.

FIG. 3 is a diagram showing an example of display of measurement results on the spectrum analyzer 10 in the present embodiment in a side-by-side fashion in an on-screen display. As shown in FIG. 3, an on-screen display on the display section 410 includes two display areas A and B. One display area A is for display of the result of measurement with one IF section 120, and a frequency spectrum in a frequency range from $f_{11}$ to $f_{12}$ is displayed in the display area A. The other display area B is for display of the result of measurement with the other IF section 220, and a frequency spectrum in a frequency range from $f_{11}$ to $f_{12}$ is displayed in the display area B, as is that in the display area A.

Thus, in the spectrum analyzer 10 in the present embodiment, measurements on two input signals can be made in parallel with each other in synchronization with the trigger signal internally generated, and the need for a device externally connected is eliminated. Consequently, the configuration for measurement can be simplified and the amounts of time and work required for measurement can be reduced.

Also, the DSPs 126 and 226 performing signal processing necessary for characteristic value measurement are provided in the two IF sections 120 and 220, respectively, thereby enabling use of hardware conventionally used and enabling reducing the development cost or the like. Also, simultaneously displaying two measurement results means the elimination of the time and work for performing an analysis operation independently from measurement by preparing an external analysis device, and means that the analysis accuracy can be easily improved.

The present invention is not limited to the above-described embodiment. Various changes and modifications may be made in the embodiment within the scope of the present invention. While two measurement results are displayed in a side-by-side fashion in the example of display shown in FIG. 3, measurement results may be displayed by being superposed one on another in a state of being discriminable from each other (for example, in different colors).

While in the above-described embodiment two identical combinations of components are provided to simultaneously measure frequency characteristics of two input signals, three or more identical combinations of components may be provided to simultaneously measure frequency characteristics of three or more input signals.

While two DSPs 126 and 226 are provided in the above-described embodiment, one DSP 126 may perform the processing in the other DSP 226 if its throughput is sufficiently high, and the other DSP 226 may be removed. The manufacturing cost can be reduced by reducing the number of component parts in this way.

While in the above-described embodiment, the sweep control section 300 performs sweep control synchronizing the two local oscillators 112 and 212 when the trigger signal is input, the sweep control section 300 may perform different sweep control processes by using two local oscillators 112 and 212. That is, the sweep control section 300 may selectively perform first sweep control starting frequency sweep in each the two local oscillators 112 and 212 simultaneously with the generation of the trigger signal, and second sweep control starting frequency sweep at different times in the two local oscillators 112 and 212. In this way, selection from the operation to simultaneously make measurements on two input signals and the operation to separately make measurements on two input signals is enabled. In another alternative, the sweep control section 300 may perform only the second sweep control.

While two local oscillators 112 and 212 are provided in the above-described embodiment, the arrangement may alternatively be such that the other local oscillator 212 is removed and the local oscillation signal from the one local oscillator 112 is used in common in the two combinations of components.

Figure 4:
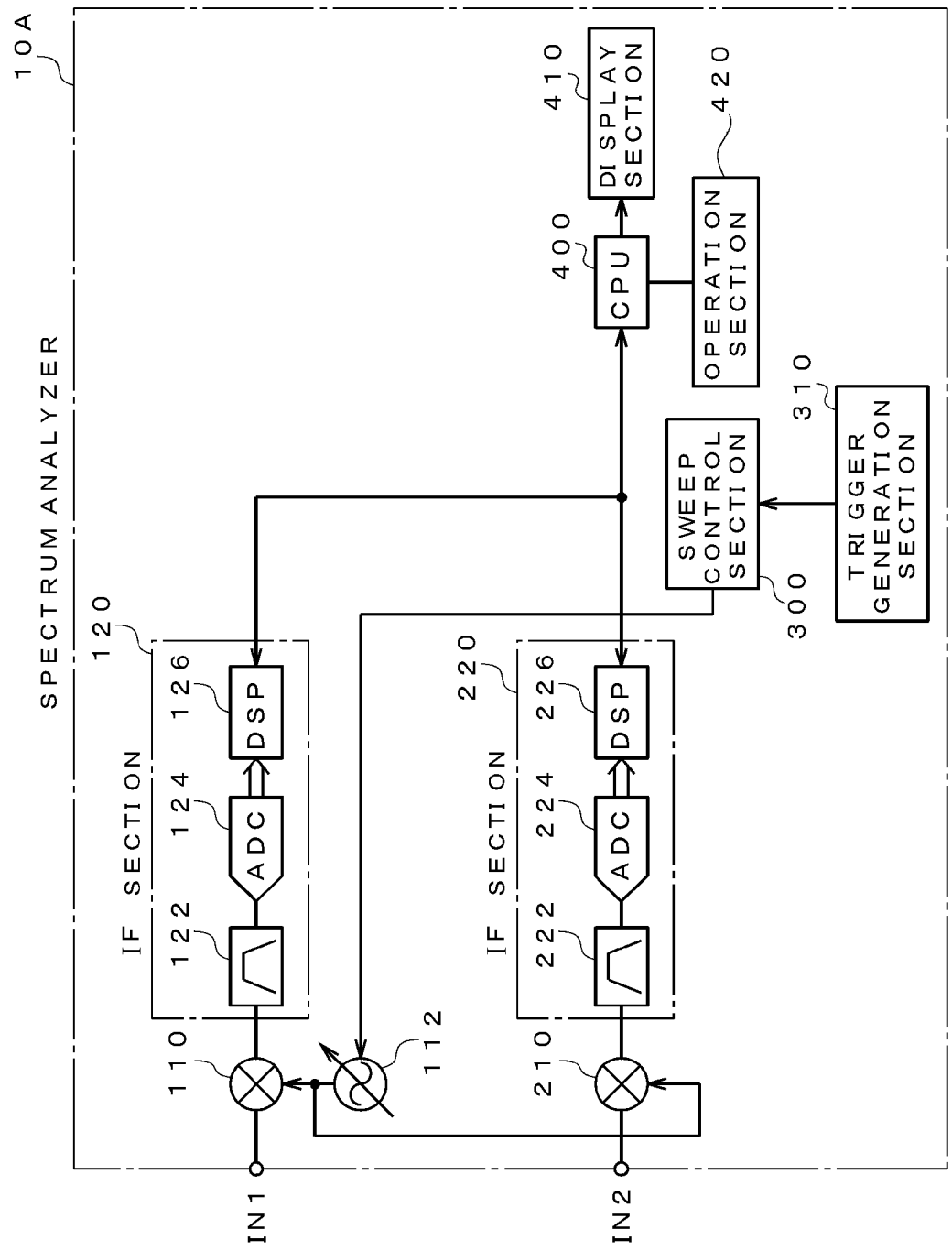
FIG. 4 is a diagram showing an example of a modification of the spectrum analyzer from which the local oscillator is removed.

FIG. 4 is a diagram showing an example of a modification of the spectrum analyzer from which the local oscillator 212 is removed. A spectrum analyzer 10A shown in FIG. 4 differs from the spectrum analyzer 10 shown in FIG. 1 in that the local oscillator 212 is removed, and that the local oscillation signal output from the local oscillator 112 is input to the two mixers 110 and 210. Use of the common local oscillation signal enables frequency sweep time alignment as well as phase alignment.

INDUSTRIAL APPLICABILITY

According to the present invention, measurements can be made in parallel with each other on a plurality of input signals in synchronization with a trigger signal internally generated and the need for an externally connected device is eliminated, so that the configuration for measurement can be simplified and the amounts of time and work required for measurement can be reduced.

The invention claimed is:

1. A frequency characteristics measuring device comprising:
   a plurality of measuring units which respectively measure frequency characteristics of a plurality of input signals; and
   a trigger generation unit which generates a trigger signal designating measurement start timing in each of the plurality of measuring units;
   further comprising a local oscillator in which frequency sweep is performed,
   wherein each of the plurality of measuring units includes:
   a mixer which performs frequency conversion of the input signal by using a local oscillation signal output from the local oscillator; and
   an intermediate frequency filter which extracts a signal component of a predetermined frequency from an intermediate frequency signal output from the mixer,
   wherein frequency sweep in the local oscillators is started in accordance with a timing of generation of the trigger signal by the trigger generation unit, and
   wherein the use of the local oscillation signal enables frequency sweep time alignment as well as phase alignment.

2. The frequency characteristics measuring device according to claim 1, wherein each of the plurality of measuring units further includes a characteristic value measuring unit which measures a characteristic value of the signal component extracted by using the intermediate frequency filter.

3. The frequency characteristics measuring device according to claim 1, further comprising a characteristic value measuring unit which measures characteristic values of the signal components extracted by using the intermediate frequency filters included in the plurality of measuring units.

4. The frequency characteristics measuring device according to claim 1, further comprising a display processing unit which simultaneously displays through a display unit the characteristic values obtained in correspondence with the plurality of measuring units.

5. The frequency characteristics measuring device according to claim 4, wherein the display processing unit displays the plurality of characteristic values in a state of being discriminable from each other.

6. The frequency characteristics measuring device according to claim 5, wherein the display processing unit displays the plurality of characteristic values in different colors.

7. The frequency characteristics measuring device according to claim 1, wherein the local oscillation signal is provided in common to at least two of the plurality of measuring units.

8. The frequency characteristics measuring device according to claim 1, wherein the local oscillation signal is provided in common to all of the plurality of measuring units.

* * * * *